United States Patent
Song et al.

(10) Patent No.: US 6,927,973 B2
(45) Date of Patent: Aug. 9, 2005

(54) DEVICE FOR JOINING AND SEPARATING STORAGE MEDIUM

(75) Inventors: Jin-Kyu Song, Seoul (KR); Hyung-Min Kim, Seoul (KR); Jeh-Hoon Phee, Seoul (KR)

(73) Assignee: IDIS Co., Ltd. (KR)

( * ) Notice: Subject to any disclaimer, the term of this patent is extended or adjusted under 35 U.S.C. 154(b) by 380 days.

(21) Appl. No.: 10/163,283

(22) Filed: Jun. 5, 2002

(65) Prior Publication Data

US 2003/0011977 A1 Jan. 16, 2003

(30) Foreign Application Priority Data

Jun. 5, 2001 (KR) .......................................... 2001-31479

(51) Int. Cl.[7] .................................................. G06G 1/16
(52) U.S. Cl. ........................ 361/685; 361/683; 361/816; 361/727; 312/223.1; 312/332.1
(58) Field of Search ................................ 361/683, 684, 361/685, 727, 732, 740, 741, 754, 769, 796–798, 801; 312/332.1, 333, 204, 111, 223.1, 223.2; 364/708.1; 74/109; 439/135, 152–155, 157–160, 310, 372

(56) References Cited

U.S. PATENT DOCUMENTS

| | | | | |
|---|---|---|---|---|
| 4,491,841 A | * | 1/1985 | Clark | 340/939 |
| 5,077,722 A | * | 12/1991 | Geist et al. | 369/75.1 |
| 5,563,767 A | * | 10/1996 | Chen | 361/685 |
| 5,586,003 A | * | 12/1996 | Schmitt et al. | 361/683 |
| 5,694,290 A | * | 12/1997 | Chang | 361/685 |
| 5,765,933 A | * | 6/1998 | Paul et al. | 312/332.1 |
| 5,797,667 A | * | 8/1998 | Wu | 312/332.1 |
| 6,011,687 A | * | 1/2000 | Gluskoter et al. | 361/686 |
| 6,193,339 B1 | * | 2/2001 | Behl et al. | 312/223.2 |
| 6,304,439 B1 | * | 10/2001 | Anderson | 361/685 |
| 6,460,948 B2 | * | 10/2002 | Roesner et al. | 312/223.1 |
| 6,473,297 B1 | * | 10/2002 | Behl et al. | 361/685 |
| 6,628,518 B2 | * | 9/2003 | Behl et al. | 361/687 |

* cited by examiner

Primary Examiner—Michaek Datskovskiy
(74) Attorney, Agent, or Firm—Cantor Colburn LLP

(57) ABSTRACT

The present invention relates to a device for joining and separating a storage medium, storing inputted data by being mounted on a computer or a digital video recorder and being simply separated from a housing of the storage medium capable of reproducing the stored data with a switching operation of a door, and comprises, a storage medium tray mounting a data storage medium thereon; a housing for receiving and guiding the storage medium tray; and a door for joining and separating the storage medium tray from the housing.

5 Claims, 5 Drawing Sheets

DEVICE FOR JOINING AND SEPARATING STORAGE MEDIUM

FIELD OF THE INVENTION

The present invention generally relates to a device for joining and separating a storage medium, more specifically, to a device for joining and separating a storage medium, storing inputted data by being mounted on a computer or a digital video recorder and being simply joined and separated from a housing of the storage medium which is capable of reproducing the stored data with a switching operation of a door.

BACKGROUND OF THE INVENTION

Generally, storage media include magnetic tape devices, floppy disk drives, CD ROM drives, hard disk drives, etc. Among these media, the hard disk drives can record a lot of data as well as keep data semipermanently, therefore they are widely used in Digital Video Recorders (DVRs) as well as computers.

In the case that a hard disk drive is used in a DVR, for instance, a connector is inserted into a front panel of the DVR through an inserting hole and is located at the backside of the front panel. The hard disk drive is reciprocally coupled with the connector located at the backside of the hard disk drive.

When changing the hard disk drive, the hard disk drive mounted through the inserting hole which is formed on the front panel is taken out to install a new hard disk drive.

When recorded data needs to be kept for a long time or the hard disk drive is full of data, disabling further data from being recorded, the hard disk drive is changed.

Like shown in a U.S. Pat. No. 5,694,290, examining a prior art for changing a hard disk drive, the hard disk drive is composed of a box body and a sheet for stabilizing a driving of the box body. The box body consists of a base, an inner side plate, and an upper cover. A handle is comprised in front of the box body.

In a domestic market, some box bodies of hard disk drives have handles.

When a user mounts the existing hard disk drive on the digital video recorder, the user pushes the handle located at the front of the box body with a hand to mount the existing hard disk drive. To change the hard disk drive, the user pulls the handle with a hand to join and separate the hard disk drive from the digital video recorder.

The hard disk drive is easily separated from the digital video recorder by the handle located at the front of the box body. However, it does not look good since the handle is exposed and moreover, it may occur a problem of pulling the handle carelessly or with curiosity during operation or without operating it, thereby causing a wrong operation.

In addition, when mounting the hard disk drive, the user should push the hard disk drive all through the operation to mount it. As a result, an accurate mounting is not secured due to irregular power or angle changes, causing a trouble in regard to mounting an accurate power and angle.

SUMMARY OF THE INVENTION

The present invention to provide a device for joining and separating a storage medium.

In one aspect of the invention, the device for joining and separating a storage medium comprises; a storage medium tray for mounting a storage medium thereon; a housing for receiving and guiding the storage medium tray; and a door for separating the storage medium tray from the housing.

In another aspect of the invention, the device for joining and separating a storage medium comprises: a storage medium tray for mounting the storage medium thereon, a housing for receiving and guiding the storage medium tray; a door for preventing the storage medium tray from being separated from the housing, and a taking-out unit located between the door and the housing, taking out the storage medium tray.

The device for joining and separating a storage medium may further comprise a door-opening prevention unit for preventing the door from being opened while driving the storage medium.

BRIEF DESCRIPTION OF THE DRAWINGS

The above and other objects and advantages of the present invention will become readily apparent from the description that follows, with reference to the accompanying drawings, in which.

DETAILED DESCRIPTION OF THE PREFERRED EMBODIMENT

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1:
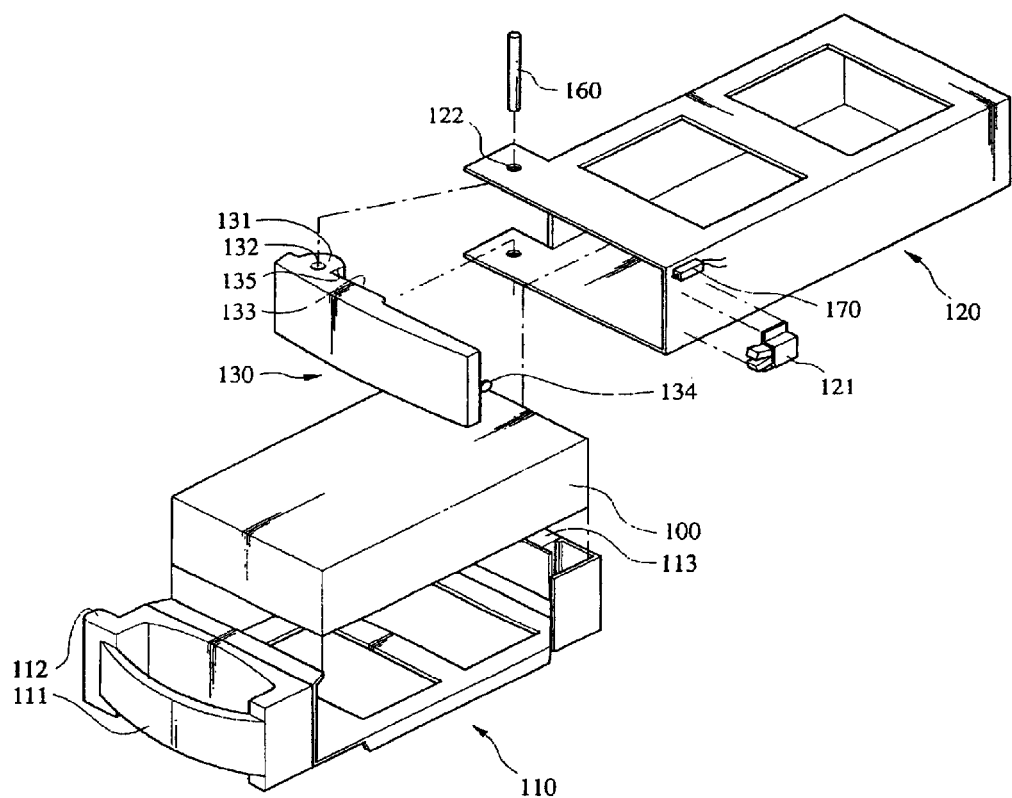
FIG. 1 is an exploded perspective view of a device for joining and separating a storage medium in accordance with one embodiment of the present invention.
Figure 2:
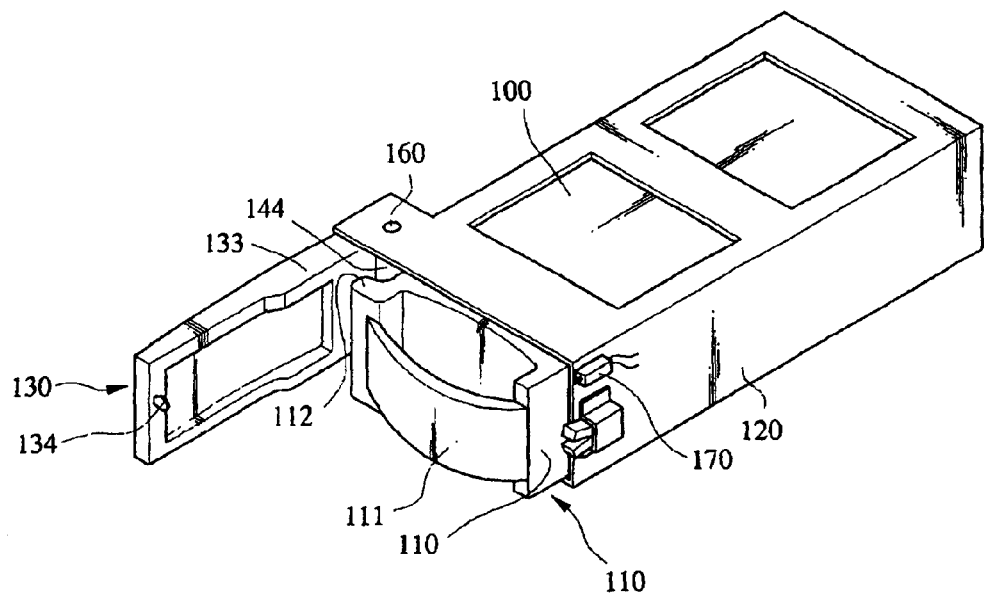
FIG. 2 is a perspective view of an assembled state of the device for joining and separating a storage medium shown in FIG. 1.

FIG. 1 is an exploded perspective view of a device for joining and separating a storage medium in accordance with one embodiment of the present invention, and FIG. 2 is a perspective view of an assembled state of the device for joining and separating a storage medium as shown in FIG. FIG. 3A to 3E are operational views of a device for joining and separating a storage medium as shown in FIG. 1.

The device for joining and separating storage medium of one embodiment of the invention comprises, a storage medium tray (110) for mounting a storage medium (100), which records and reproduces data, thereon, a housing (120) for receiving and guiding the storage medium tray (110) and a door (130) for taking out the storage medium tray (110) by being coupled with one front side of the housing (120).

At the front of the storage medium tray (110), a handle (111) forming a suspension unit (112) which is capable of easily taking out the storage medium (100) is disposed on one side.

A door-locking unit (121) to be locked and unlocked by pressing is disposed on the other external side of the housing (120).

On one side of the door (130), a hinge (131) takes out the storage medium tray (110) by being coupled with one side of the housing (120), and the hinge (131) has a pin hole (132) pierced to the lower part and a suspension end (135) on one side, and has an inserting section (133) for inserting a handle (111) of the storage medium tray (110) by pushing one side of the handle (111) in connection with the hinge (131). On the other side of the door (130), a locking projector (134) is inserted to the door-locking unit (121) of the housing (120).

A door-opening prevention unit (170) is located on the other side of the housing (120) for preventing the door (130) from being opened while operating the storage medium (100).

The door-opening prevention unit (170) includes a common solenoid turning on/off by an electrical signal.

Reference number 113 represents a connector connected with an apparatus and reference number 122 represents a pin hole.

Figure 4:
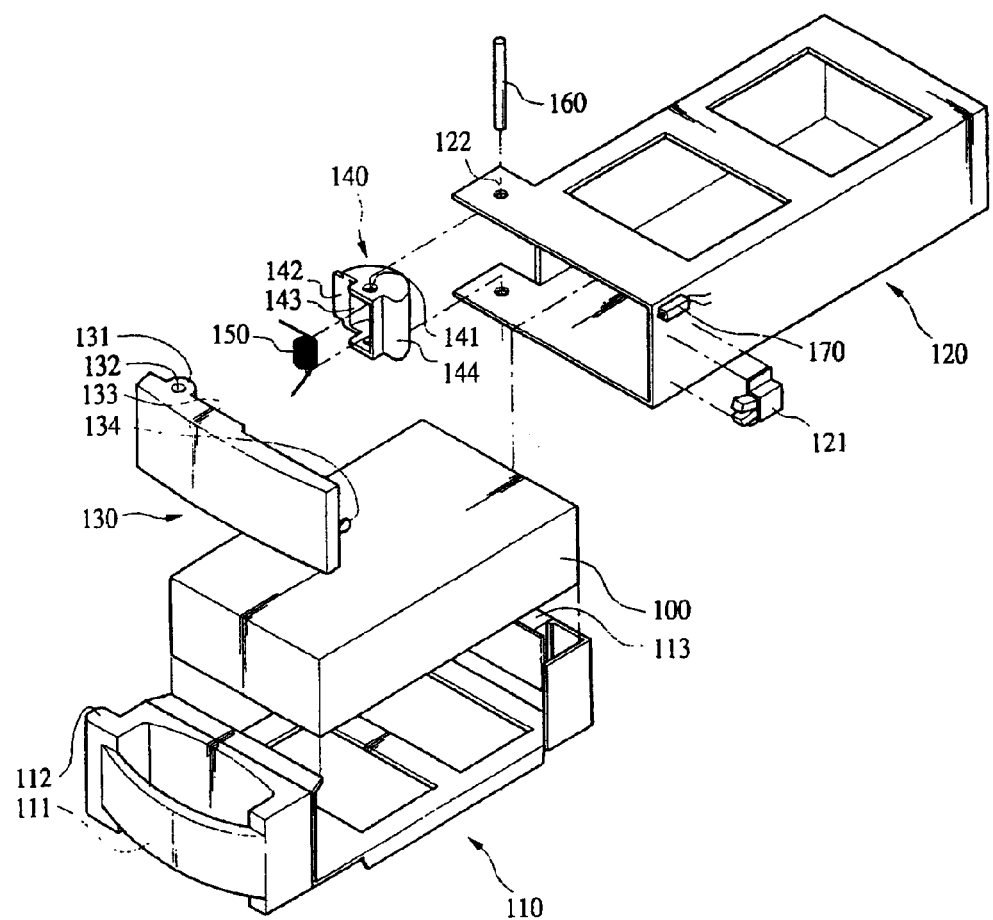
FIG. 4 is an exploded perspective view of a device for joining and separating a storage medium in accordance with another embodiment of the present invention.

FIG. 4 is a device for joining and separating a storage medium in accordance with another embodiment of the present invention.

The device, as shown in FIG. 4, comprises a storage medium tray (110) mounting a storage medium (100) thereon, a housing (120) for receiving and guiding the storage medium tray (110), a door (130) for preventing the storage medium tray (110) from being separated from the housing (120), and a taking-out unit (140) located between the door (130) and the housing (120) out the storage medium tray (110).

The taking-out unit (140) forms a pin hole (141) pierced to the upper part from the lower part. A door-opening restriction unit (142) is formed to restrict an opening angle of the door (130) on one section of the taking-out unit (140). On a central part, an inserting unit (143) is formed to insert an elastic unit (150) for giving elasticity while opening the door (130). On the other section, a taking-out section (144) takes out a suspension unit (112) of the storage medium tray (110).

The taking-out unit (140) for coupling one side of the housing (120) with the hinge (131) of the door (130) is coupled by a pin (160).

The elastic unit (150) includes a common spring.

A handle (111) is set on a front side and the storage medium (100) is set on the storage medium tray (110) forming the suspension unit (112) on one side.

A door-locking unit (121) is attached to the other side of the housing (120) to which the storage medium tray (110) is inserted.

The door (130) having the hinge (131) is coupled with a pin hole (122) of the housing (120) by the pin (160) through a pin hole (122) of the housing (120) on one side of the housing (120), or like shown in FIG. 4, the pin hole (132) of the door (130) is coupled with the pin hole (122) of the housing (120) by the pin (160), to couple the door (130) with one side of the housing (120), in the state of the taking-out unit (140) composed of the pin hole (141), the door-opening restriction unit (142), the inserting unit (143), and the taking-out section (144) being elastically supported by the elastic unit (150).

When the storage medium tray (110) for mounting the storage medium (100) thereon is inserted to the housing (120) through the door (130) and the door (130) is closed, after the coupling between the housing (120) and the door (130) is completed, the inserting section (133) having the door (130) pushes a handle (111) formed at a front side of the storage medium tray (110), thereby coupling a connector of the housing (120) with a connector (112) as the storage medium tray (110) reverses. As a result, like shown in FIG. 3A, a mounting of the storage medium tray (110) is completed.

If a user presses the other part of the door (130) to change the storage medium (100), the door-locking unit (121) of the housing (120) is unlocked to open the door (130), and like shown in FIG. 4, if the elastic unit (150) elastically supports the hinge (131), the door (130) is naturally opened by the elastic unit (150) while the door (130) is unlocked from the door-locking unit (121).

Figure 3A:
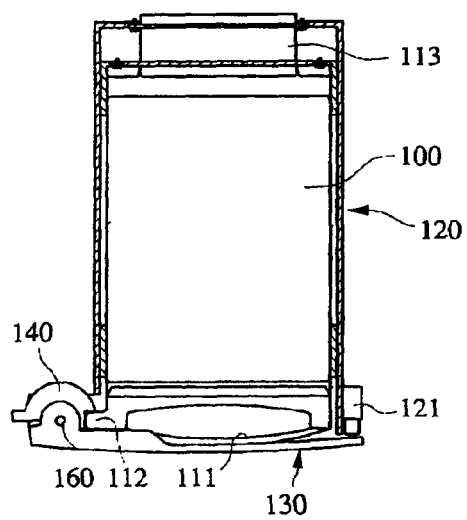
FIGS. 3A to 3E are operational views of the device for joining and separating a storage medium shown in FIG. 1.
Figure 3B:
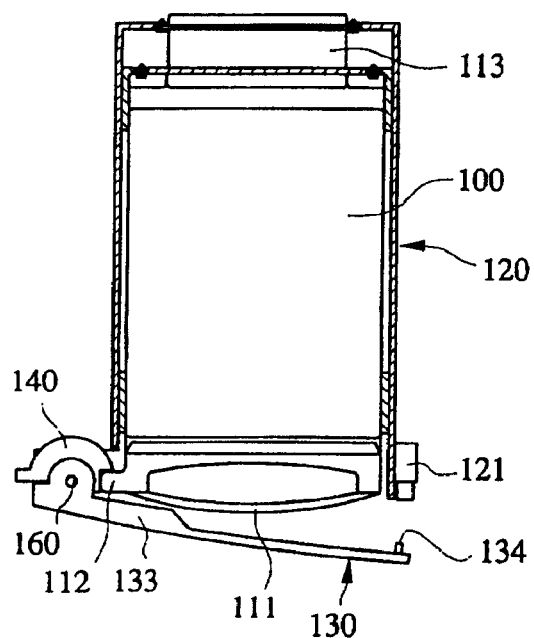

At this time, the door (130), like shown in FIG. 3B, is not opened any more because the hinge (131) of the door (130) is suspended by the door-opening restriction unit (142) for restricting rotation of the door (130).

Figure 3C:
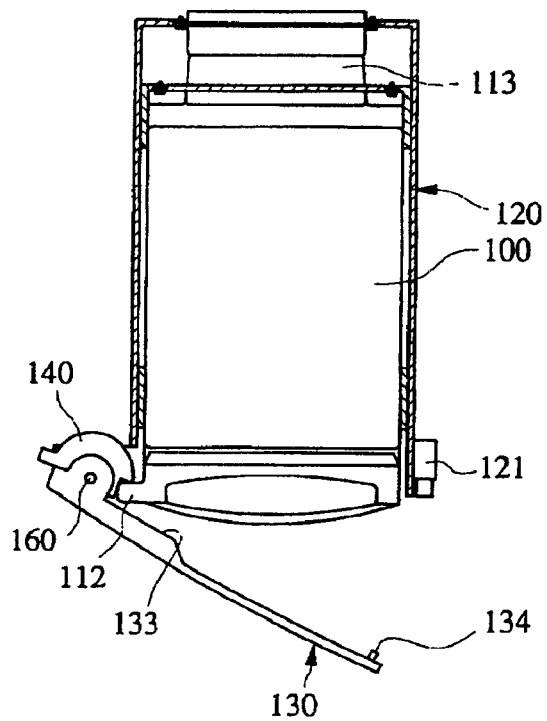
Figure 3D:
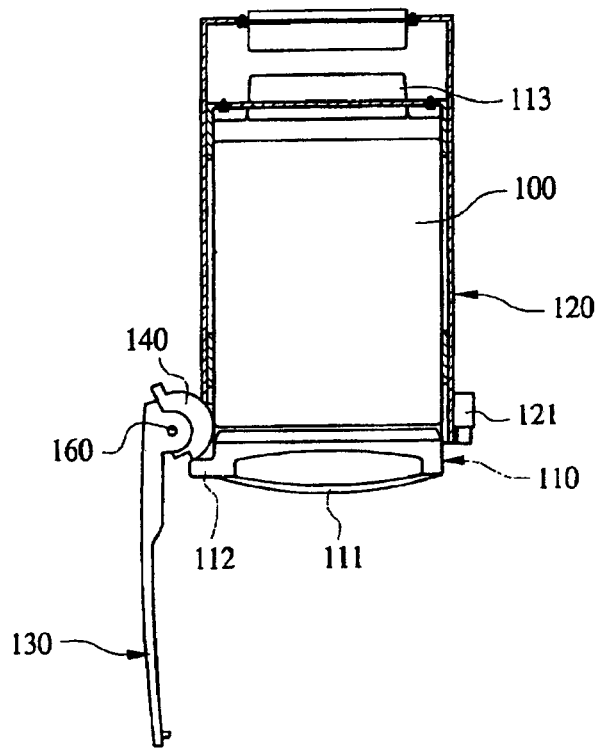

If the user opens the door (130) more in the state of the door (130) being opened, a suspension end (135) of the hinge (131) coupled by the pin (160) based on rotation of the opened door (130) begins to take out the storage medium tray (110) from the housing (120) by pulling the suspension unit (112) formed on a front side of the storage medium tray (110), just as the taking-out section (144) in accordance with rotation of the taking-out unit (140) shown in FIG. 4 pulls the suspension unit (112) as shown in FIG. 3C. Then, the storage medium tray (110), like shown in FIG. 3D, takes out the storage medium tray (110) within a rotation radius of the taking-out unit (140).

Figure 3E:
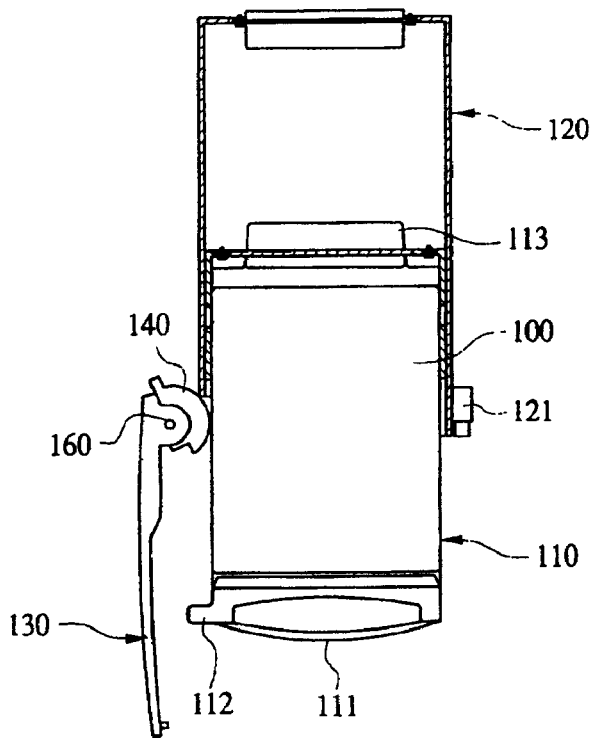

If the user pulls the handle (111) of the storage medium tray (110) in a front direction in the state of the storage medium tray (110) being taken out, the storage medium tray (110) is perfectly taken out from the housing (120), like shown in FIG. 3E, therefore it is possible to change the storage medium tray (110).

If the changing of the storage medium tray (110) is completed, the user inserts the storage medium tray (110) in a back direction from the front direction of the housing (120), like shown in FIGS. 3E to C, to push the storage medium tray (110) until the storage medium tray (110) is suspended in the hinge (131) of the door (130) or the taking-out section (144) of the taking-out unit (140).

If the user closes the door (130), the inserting section (132) of the door (130) pushes the suspension unit (112) formed on one front side of the storage medium tray (110) to connect the connector of the housing (120) with the connector (112) of the storage medium tray (110) as the storage medium tray (110) keeps reversing, and a locking projector (133) formed on the other side of the door (130) is coupled with the door-locking unit (121) of the housing (120) to complete a mounting of the storage medium tray (110).

If the storage medium (100) is operated in the state of the storage medium tray (110) being mounted, a door-opening prevention unit (170) mounted on the other side of the housing (120) operates to prevent the door (130) from moving, thereby preventing the door (130) from being opened while operating the storage medium (100). As a result, an error caused by the opened door (130) is prevented in advance.

According to the present invention described above, it is convenient and reliable because a storage medium tray for mounting a storage medium thereon can be exactly joined and separated from a housing to which the storage medium tray is inserted.

What is claimed is:

1. A device for joining and separating a storage medium, comprising:
   a storage medium tray for mounting a data storage medium thereon;
   a suspension unit formed at a front face of the storage medium tray;
   a housing for receiving and guiding the storage medium tray;
   a door for taking out the data storage medium tray from the housing, the door including a hinge on one section and an inserting section for inserting the storage medium tray by pushing the storage medium tray in connecting with the hinge; and
   a suspension end formed at a side of the hinge, the suspension end being engaged with the suspension unit to take out the storage medium tray from the housing.

2. The device for joining and separating the storage medium of claim 1, wherein the housing has a door-locking unit being locked and unlocked by pressing.

3. A device for joining and separating a storage medium, comprising:
   a storage medium tray mounting a data storage medium thereon;
   a suspension unit formed at a front face of the storage medium tray;
   a housing for receiving and guiding the storage medium tray;
   a door for preventing the storage medium tray from being separated at a front side or the housing; and
   a taking-out unit located between the door and the housing, for taking out the storage medium tray, the taking-out unit including:
      a pin hole pierced to a lower part from an upper part;
      a door-opening restriction unit for restricting an opening angle of the door;
      an elastic unit inserted to the inserting part, giving elasticity to the opened door; and
      a taking-out section formed at a side of the taking-out unit, the taking-out section being engaged with the suspension unit to take out the storage medium tray from the housing.

4. The device for joining and separating the storage medium of claim 3, wherein the elastic unit includes a spring.

5. The device for joining and separating the storage medium of claim 3, wherein the housing has a door-opening prevention unit for preventing the door from being opened while operating the storage medium.

* * * * *